(12) United States Patent
Shang

(10) Patent No.: US 8,617,350 B2
(45) Date of Patent: Dec. 31, 2013

(54) LINEAR PLASMA SYSTEM

(75) Inventor: Quanyuan T. Shang, Sunnyvale, CA (US)

(73) Assignee: Belight Technology Corporation, Limited, George Town (KY)

( * ) Notice: Subject to any disclaimer, the term of this patent is extended or adjusted under 35 U.S.C. 154(b) by 0 days.

(21) Appl. No.: 13/161,317

(22) Filed: Jun. 15, 2011

(65) Prior Publication Data

US 2011/0305847 A1 Dec. 15, 2011

(51) Int. Cl.
*H01L 21/20* (2006.01)
*H01L 21/283* (2006.01)
*H01L 21/3065* (2006.01)

(52) U.S. Cl.
USPC ........... 156/345.34; 118/715; 118/723 E; 118/723 MP; 156/345.33; 427/569; 427/571

(58) Field of Classification Search
USPC ........... 118/715, 723 E, 723 MP; 156/345.33, 156/345.34; 427/571
See application file for complete search history.

(56) References Cited

U.S. PATENT DOCUMENTS

| | | | |
|---|---|---|---|
| 4,859,908 A * | 8/1989 | Yoshida et al. ......... | 315/111.81 |
| 6,140,773 A | 10/2000 | Anders et al. | |
| 6,444,945 B1 | 9/2002 | Maschwitz et al. | |
| 6,821,563 B2 * | 11/2004 | Yudovsky ................. | 427/248.1 |
| 6,911,779 B2 | 6/2005 | Madocks | |
| 7,038,389 B2 | 5/2006 | Madocks | |
| 7,294,283 B2 | 11/2007 | Madocks | |
| 7,327,089 B2 | 2/2008 | Madocks | |
| 7,411,352 B2 | 8/2008 | Madocks | |
| 2004/0035358 A1 * | 2/2004 | Basceri et al. ................. | 118/715 |
| 2004/0168771 A1 * | 9/2004 | Mitrovic .................. | 156/345.46 |
| 2007/0148349 A1 * | 6/2007 | Fukada ......................... | 427/248.1 |
| 2009/0139453 A1 * | 6/2009 | Chen et al. .................. | 118/723.1 |
| 2010/0028238 A1 * | 2/2010 | Maschwitz .................... | 423/335 |
| 2010/0133234 A1 * | 6/2010 | Yoshida et al. .................. | 216/67 |
| 2010/0255625 A1 * | 10/2010 | De Vries .......................... | 438/57 |
| 2010/0304571 A1 * | 12/2010 | Larson et al. .................. | 438/710 |
| 2011/0056912 A1 * | 3/2011 | Matsuyama ..................... | 216/59 |

OTHER PUBLICATIONS

Simply Blue, Anti-reflection Coating and Passivation of Crystalline Silicon Solar Cells, Roth and Rau AG, Photon Expo, Shenzhen, Jan. 1, 2008.
SiNA/MAiA Modular Based Platform for PECVD Antireflective Coating Equipment for Crystalline Solar Cells, Roth and Rau, http://www.roth-rau.de/konzern/roth/datenbanken/produkte/Prospekt_SiNA_MAiA_12881075192.pdf, accessed Jun. 15, 2011.

* cited by examiner

*Primary Examiner* — Parviz Hassanzadeh
*Assistant Examiner* — Satish Chandra
(74) *Attorney, Agent, or Firm* — Osha Liang LLP

(57) ABSTRACT

The invention relates to a linear plasma system. The linear plasma system includes a number of troughs of an electrode alternating with a number of peaks of the electrode forming a sawtooth shape, a reactive gas feed, a precursor gas feed, and a power source. The reactive gas feed is disposed on the electrode and configured to continuously release a reactive gas into an array of holes located at the trough apex. The precursor gas feed is disposed on the electrode and configured to continuously release a precursor gas into an array of holes located at the peak apex. The power source is configured to apply radio frequency power to the electrode to simultaneously interact with the reactive gas mixed with the precursor gas to generate plasma, which is used to create a product that is deposited on a substrate.

14 Claims, 10 Drawing Sheets

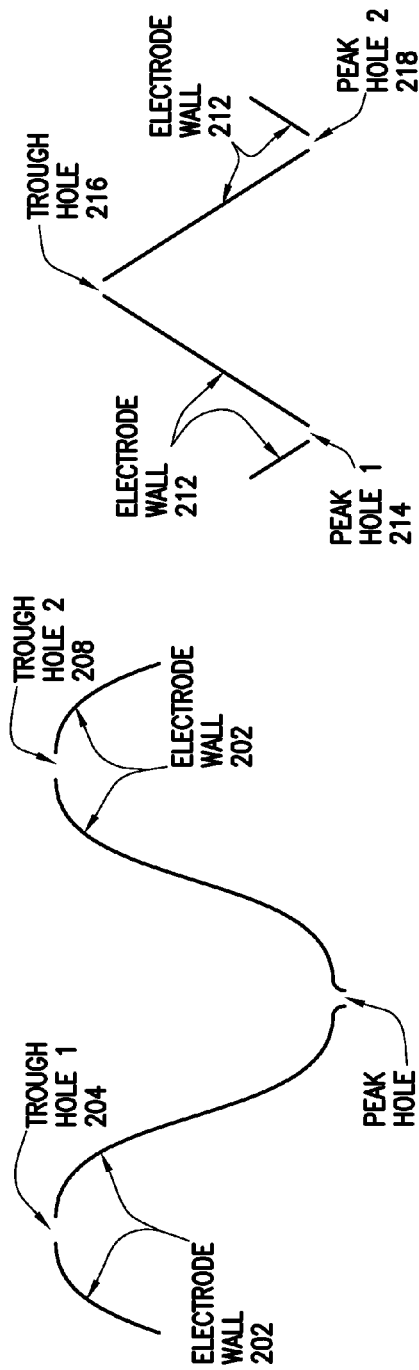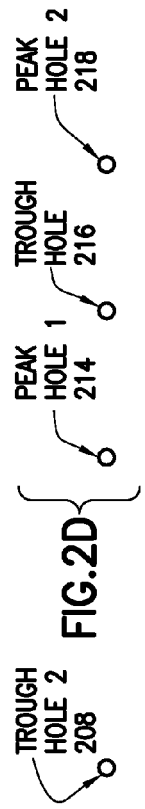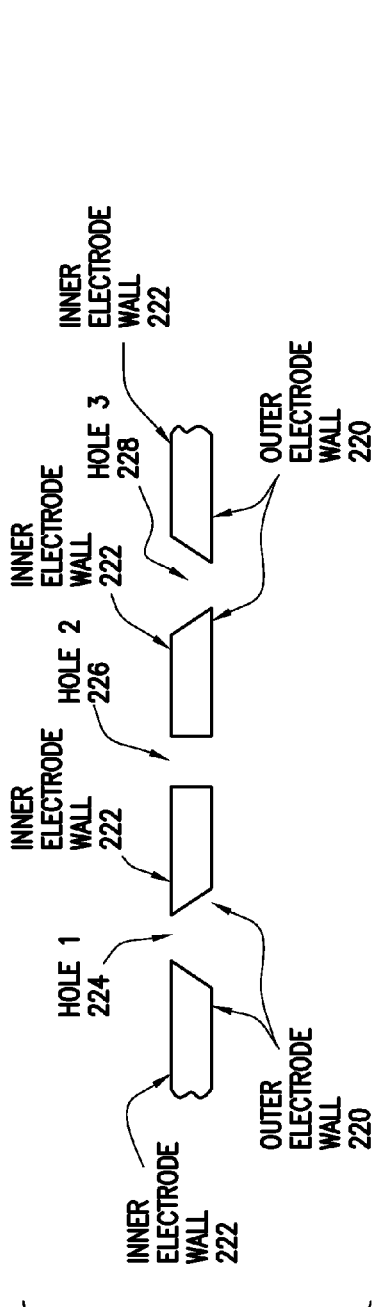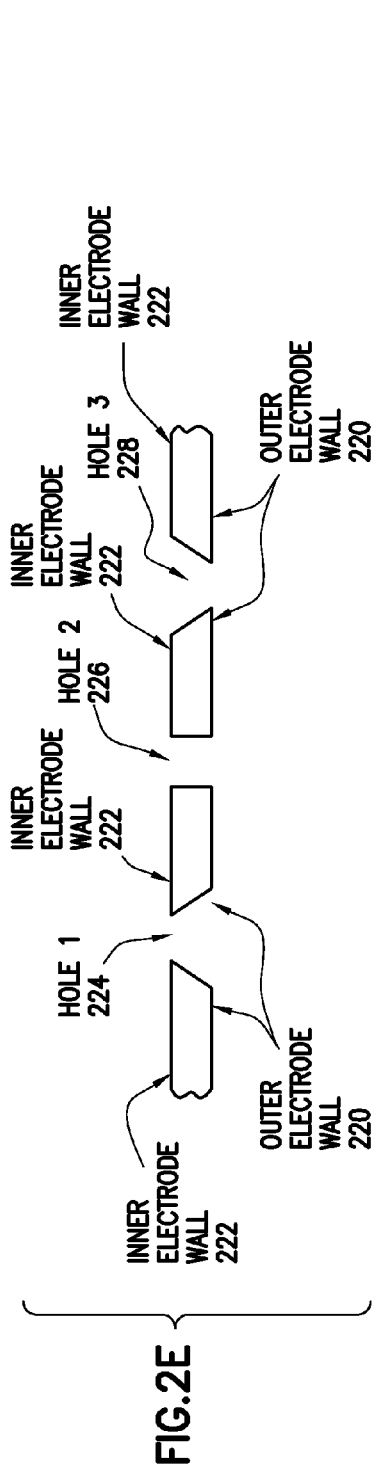

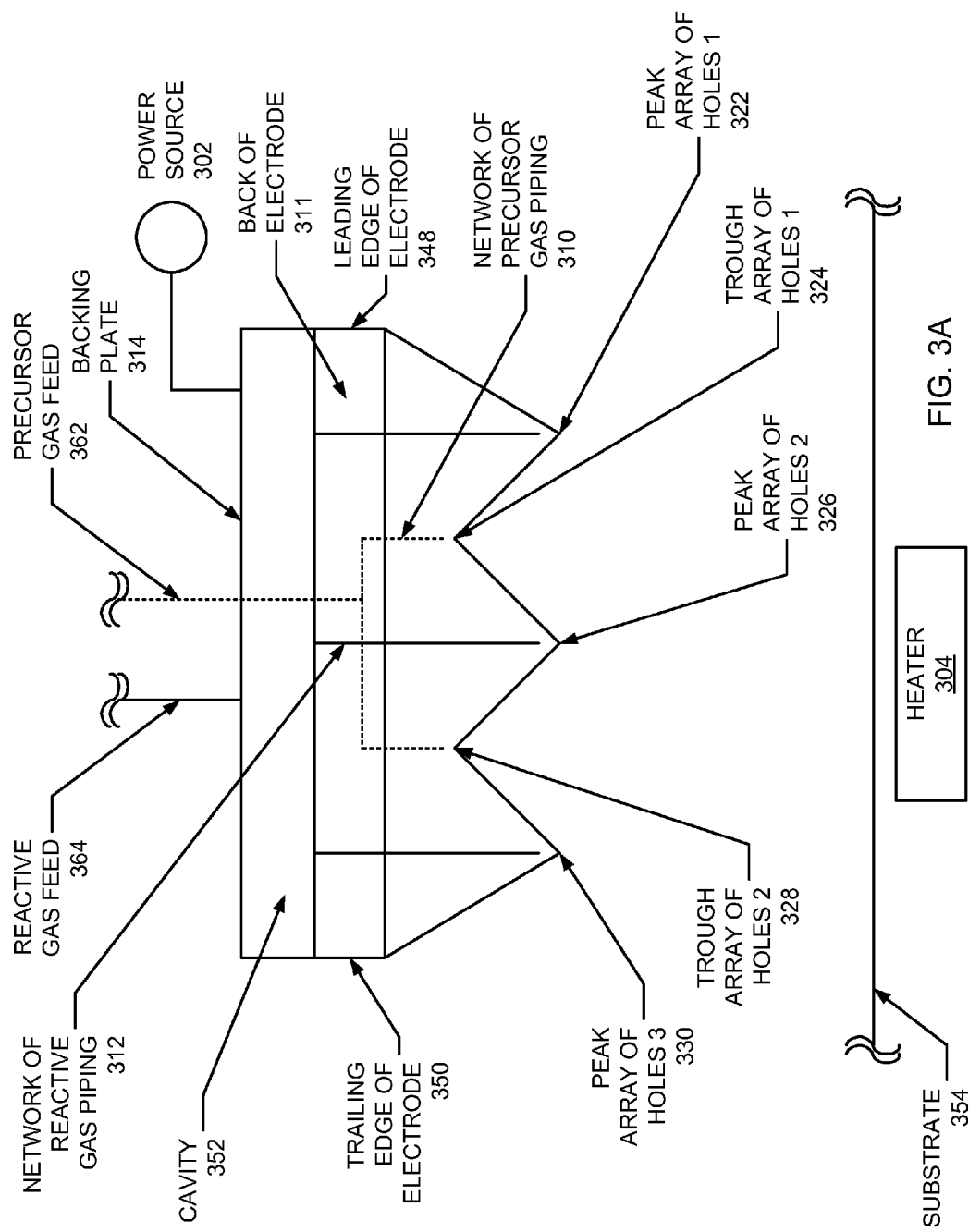

LINEAR PLASMA SYSTEM

BACKGROUND

Plasma is used in a number of industrial manufacturing applications, such as semiconductors, displays, solar technologies, and lighting. The plasma is applied to a substrate, which is processed one or more ways, including but not limited to plasma enhanced chemical vapor deposition, plasma etching, plasma surface treatment, and ion implantation. The substrate may vary in length, thickness, and width. The substrate may also be treated with an activated precursor, which prepares the substrate for a particular application of plasma. A number of the applications of plasma processing use a static mode, where the substrate sits stationary in the processing chamber while the plasma is applied.

SUMMARY

In general, in one aspect, the invention relates to a linear plasma system. The linear plasma system includes a number of troughs of an electrode alternating with a number of peaks of the electrode, a reactive gas feed, a precursor gas feed, and a power source. The troughs and peaks of the electrode form a sawtooth shape. Each trough has an array of holes located at a trough apex, and each peak has an array of holes located at a peak apex. The reactive gas feed is disposed on the electrode and configured to continuously release a reactive gas into each array of holes located at the trough apex. The precursor gas feed is disposed on the electrode and configured to continuously release, while the reactive gas feed releases the reactive gas, a precursor gas into the array of holes located at the peak apex. The power source is configured to apply radio frequency power to the electrode to simultaneously interact with the reactive gas mixed with a first portion of the precursor gas to generate plasma. The resulting product is deposited on the substrate as the substrate passes underneath the electrode.

In general, in one aspect, the invention relates to a method for processing a substrate using a linear plasma system. The method steps include (1) injecting a reactive gas into a first array of holes on a plurality of troughs, wherein the first array of holes is disposed on an electrode having a sawtooth shape, (2) injecting, while injecting the reactive gas, a precursor gas into a second array of holes on a plurality of peaks, wherein the second array of holes is disposed on the electrode, (3) channeling the reactive gas through the first array of holes into a gap between a front surface of the electrode and the substrate, (4) channeling the precursor gas through the second array of holes into the gap, (5) applying radio frequency power to the electrode, where the radio frequency power interacts with a first portion of the reactive gas mixed with a first portion of the precursor gas to generate plasma in the gap, where the plasma interacts with a second portion of the precursor gas and a second portion of the reactive gas to form a product of an activated precursor and reactive gas, and (6) depositing the product of the activated precursor and the reactive gas onto a top side of the substrate as the substrate passes underneath the first electrode.

Other aspects of the invention will be apparent from the following description and the appended claims.

BRIEF DESCRIPTION OF DRAWINGS

FIGS. 2A through 2E each show a portion of an electrode in accordance with one or more embodiments of the invention.

FIGS. 3A and 3B each show an electrode and associated gas feeds in accordance with one or more embodiments of the invention.

DETAILED DESCRIPTION

Figure 1A:
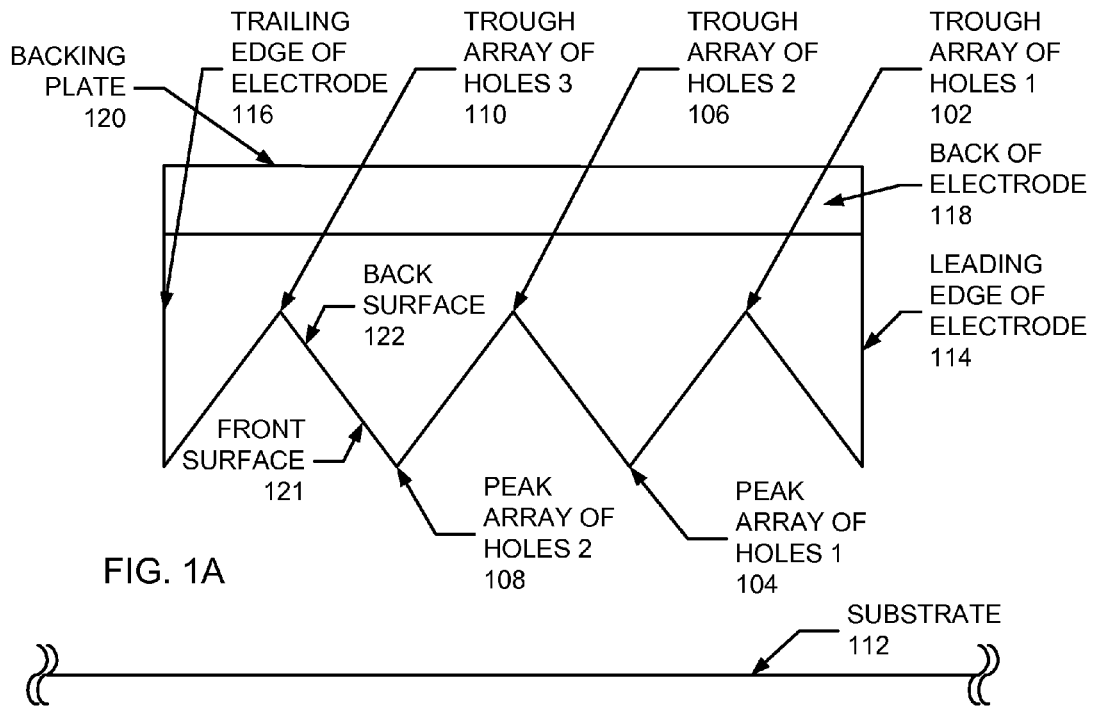
FIGS. 1A through 1C each show a portion of an electrode in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention describe a method and system for generating and applying plasma to a substrate. Specifically, one or more embodiments of the invention include an electrode having a sawtooth shape. The sawtooth shape of the electrode may be any of a number of configurations that include one or more holes (i.e., an array of holes) on a peak and one or more holes on a trough. As described herein, a hole may include a nozzle, as when the wall of the electrode near a hole protrudes or otherwise deviates from the rest of the wall of the electrode to accommodate the hole. The electrode may also include a separate feed for the precursor gas and the reactive gas, which are fed simultaneously and continuously into the arrays of holes at the peaks and troughs, respectively. The precursor and reactive gases may flow through the arrays of holes to exit the electrode. A power source may apply energy (e.g., radio frequency power) to the electrode. The energy may interact with a mixture of the precursor and reactive gases outside the electrode, generating plasma in gaps between the electrode and the substrate passing underneath the electrode by activating the precursor and reactant. Further, the energy may interact with the reactive gas to generate activated precursor. Next, the substrate is processed when the activated precursor and plasma are deposited on the substrate.

In one or more embodiments of the invention, a precursor gas is a gas that includes one or more chemical elements that may be condensed into a solid form. When the precursor gas interacts with energy from an energy source, an activated precursor may be generated. The activated precursor may be chemically able to bond to or condense upon a surface (e.g., a substrate) in a solid form. The condensed portion of the activated precursor may be a pure element, a mixture of elements, a compound derived from chemical elements of the precursor gas and reactants, or a mixture of compounds. Examples of a precursor gas include, but are not limited to, silane ($SiH_4$), borane, hydrocarbon, germane, phosphine, tetraethylorthosilicate (TEOS), trimethylaluminium ($Al(CH_3)_3$), titanium tetrachloride ($TiCl_4$), and/or tetramethyltin. In one or more embodiments of the invention, the precursor gas is delivered to one or more portions of a linear plasma system in vapor form. As described herein, any mixture of elements and/or compounds included in a precursor gas may be mixed prior to being fed to the electrode.

In one or more embodiments of the invention, a reactive gas (also sometimes called a reactant or reactant gas) is a gas or mixture of gases that includes oxygen, nitrogen, and/or ammonia. The oxygen and/or nitrogen may form oxides or nitrides with the precursor gas when the reactive gas interacts with energy in the plasma from a power source. Other reactant gases may include fluorine, chlorine, and/or other halogens. A reactant gas may be differentiated from a precursor gas by the fact that even when energized or chemically decomposed, condensable molecular entities are not formed. A reactive gas may react and become chemically incorporated into a solid deposition derived from a precursor gas. Other examples of a reactive gas include, but are not limited to, hydrogen ($H_2$), helium, nitrous oxide ($N_2O$), and/or argon. One or more of these reactive gases may not form a deposit on a substrate, but may aid in the formation of stable plasma.

In one or more embodiments of the invention, the system and method described herein occurs in a vacuum. The vacuum conditions may be used for one or more of a number of reasons, including but not limited to ensuring proper application of the plasma and/or activated precursor (described below) and isolating the energy applied to the electrode by the power source. The vacuum system may also be configured to remove excess precursor gas and/or excess reactive gas during operation of the linear plasma system. A vacuum system may operate at 100 mTorr, but may range between 10 mTorr and 10,000 mTorr.

Further, one or more of a number of cooling systems (e.g., water cooling), known in the art, may be used to cool the electrode and prevent overheating and/or to maintain a temperature within a certain range of temperatures while using one or more embodiments of the invention. Further, the electrode (including any nozzles) may be covered with a conductive or insulating material for easy maintenance and to reduce deposition on the electrode of, for example, plasma and/or activated precursor.

Figure 1B:
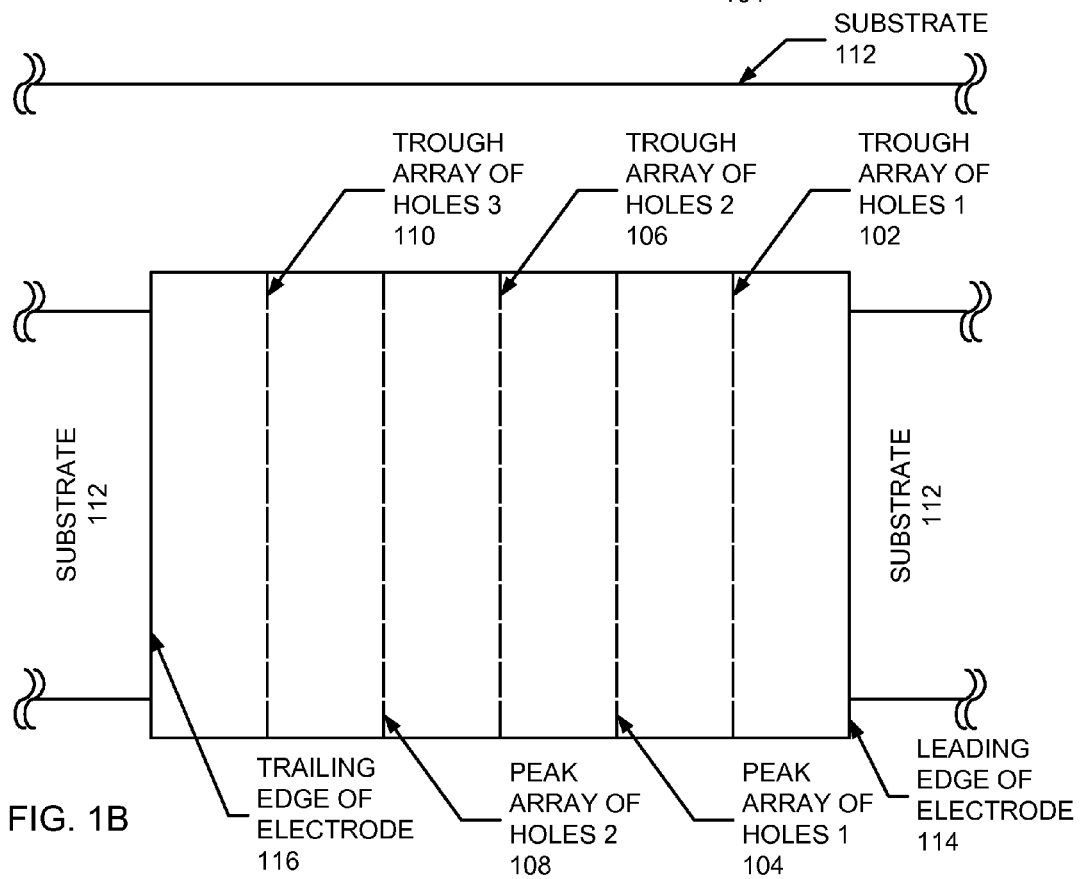
Figure 1C:
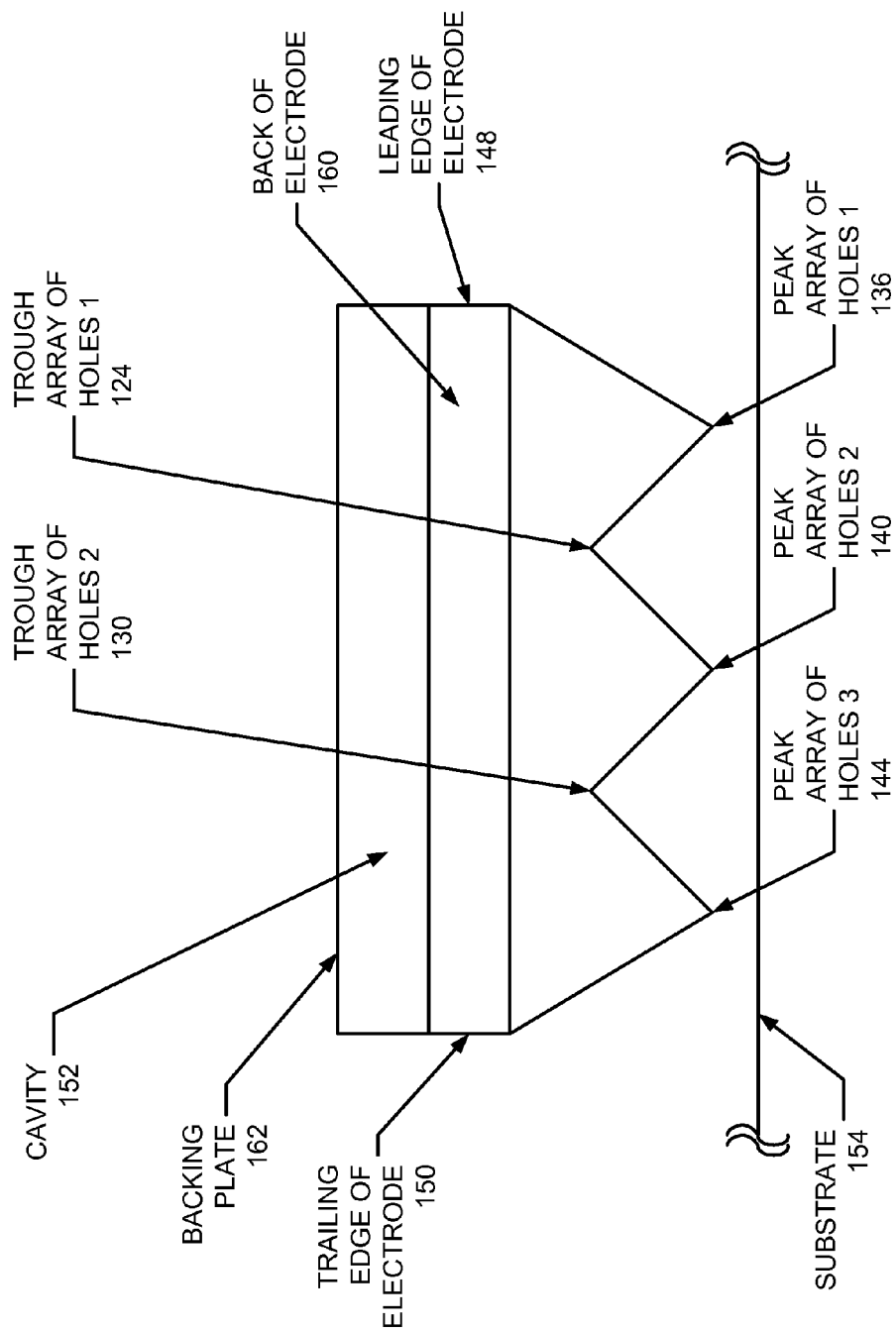

FIGS. 1A through 1C each show a portion of an electrode in accordance with one or more embodiments of the invention. Specifically, FIGS. 1A and 1B show different views of an electrode with five arrays of holes that extend along the length of the electrode and are used to process a substantially continuous substrate (112) along the width of the substrate (112) as the substrate (112) moves continuously along its length. FIG. 1A shows a side view or vertical cross section of the electrode. FIG. 1B shows a top view or a horizontal cross section of the electrode. One skilled in the art will appreciate that the electrode described herein is only one embodiment and each electrode may have any number of holes of a variety of different shapes placed at a variety of locations and in a variety of different orders within the electrode.

In one or more embodiments of the invention, the substrate (112) is two or more discrete substrates that are processed in series. In other words, the substrate (112) moves in a direction (e.g., from right to left in FIGS. 1A and 1B) relative to the electrode. The electrode shown in FIGS. 1A and 1B has a leading edge (114) and a trailing edge (116), signifying the direction in which the substrate (112) moves relative to the electrode.

The substrate (112) may have a top side (facing the electrode) and a bottom side (facing away from the electrode). The substrate may be one or more small wafers that rest on a carrier or platform. The carrier or platform may be a series of rollers, a conveyor belt, or some other suitable apparatus for moving the substrate during processing. The carrier or platform may be made out of one or more of a number of materials, including but not limited to graphite, ceramic, and glass. In one or more embodiments of the invention, the dimension of the electrode between the leading edge (114) and a trailing edge (116), shown in FIG. 1A, is the width of the electrode. The distance between the electrode and the substrate (112) may vary, depending on one of a number of factors, including but not limited to the type of processing required, the amount of power used in the power source, whether a vacuum system is used, the types of gases used, the pressures of the gases, and the size of the holes in the electrode.

The electrode may be made from one or more of a number of materials, including but not limited to aluminum and stainless steel. The length of the electrode may vary. In one or more embodiments of the invention, the length of the electrode is one meter or greater. The walls of the electrode (e.g., the troughs, the peaks) may have a uniform or varying thickness throughout.

As shown in FIG. 1A, the portion of the electrode shown from the side has a sawtooth shape. Specifically, the sawtooth shape shown in FIG. 1A includes two arrays of holes (peak array of holes 1 (104) and peak array of holes 2 (108)) with a concave shape at the bottom of the sawtooth shape and three arrays of holes (trough array of holes 1 (102), trough array of holes 2 (106), and trough array of holes 3 (110)) with a convex shape at the top of the sawtooth shape of the electrode. The arrays of holes as named herein (i.e., peak array of holes, trough array of holes) are merely meant to provide a frame of reference and may be called by other names. Further, the term "sawtooth" may refer to any number of configurations involving one or more peak array of holes and one or more trough array of holes.

In one or more embodiments of the invention, each of the array of holes (e.g., peak array of holes 1 (104), trough array of holes 3 (110)) allow the precursor gas (in the case of the peak array of holes) and reactive gas (in the case of the trough array of holes) pass outside the electrode. The sawtooth shape of the electrode may have any combination of any number of peak holes and any number of trough holes in any order and shape. The arrays of holes of the electrode may alternate between peak and trough, as shown in FIGS. 1A through 1C, may be arranged in some other organized pattern (e.g., two peak array of holes in parallel followed by two trough array of holes in parallel), may be arranged in some random order, or any suitable combination thereof.

Further, the portion of the electrode in FIG. 1A forming the sawtooth shape has a front surface (121) and a back surface (122). The front surface (121) faces outside the electrode toward the substrate (112), while the back surface (122) faces the interior of the electrode.

The electrode shown in FIG. 1A includes a back of electrode (118), which represents a volume of space above each of the array of holes (e.g., peak array of holes 1 (104), trough array of holes 3 (110)). A backing plate (120) borders the top of the electrode, which in FIG. 1A is the portion of the back of electrode (118) that is furthest away from the arrays of holes.

FIG. 1B shows a cross-sectional top view of the electrode in FIG. 1A. The two peak array of holes (peak array of holes 1 (104) and peak array of holes 2 (108)) and the three trough array of holes (trough array of holes 1 (102), trough array of holes 2 (106), and trough array of holes 3 (110)) each form a continuous line along the width of the electrode. Each array of holes of an electrode may also be configured in other ways, including but not limited to a funnel shape, a point with straight edges tapering down the sides, and a chute fed from a number of straight edges. Further, as shown in FIG. 1B, the length of the electrode is slightly greater than the width of the substrate. In one or more embodiments of the invention, the length of the electrode alternatively may be the same as the width of the substrate (112) or less than the width of the substrate (112).

In one or more embodiments of the invention, the walls of the electrodes that lead from each array of holes (e.g., peak array of holes 1 (104) and peak array of holes 2 (108)) at the peak to each array of holes (e.g., trough array of holes 1 (102), trough array of holes 2 (106), and trough array of holes 3 (110)) at the trough is seamless and continuous. The continuous wall may be one of a number of shapes, including but not limited to a straight line, a concave arc, a convex arc, or any other suitable two- or three-dimensional shape. For example, the walls of the electrode shown in FIGS. 1A and 1B are flat, seamless planes.

FIG. 1C shows a side view of an electrode configured differently from the electrode in FIG. 1A. Specifically, in FIG. 1C, the portion of the electrode, shown in a side view, has a sawtooth shape. In this instance, the sawtooth shape shown in FIG. 1C includes three arrays of holes (trough array of holes 1 (124) and trough array of holes 2 (130)) at the top of the sawtooth shape and three arrays of holes (peak array of holes 1 (136), peak array of holes 2 (140), and peak array of holes 3 (144)) at the bottom of the sawtooth shape of the electrode.

As in the case of FIG. 1A, the portion of the electrode shown in FIG. 1C has a leading edge (148) and a trailing edge (150). The electrode also includes a back of electrode (160), which represents a volume of space above each of the array of holes (e.g., peak array of holes 1 (136), trough array of holes 1 (124)). Further, the substrate (154) is positioned beneath the arrays of holes for processing. The electrode of FIG. 1C also includes a cavity (152), positioned above the arrays of holes, that may be used to distribute one of the gases (e.g., precursor gas or reactive gas) substantially evenly among the arrays of holes configured to receive the gas. For example, the reactive gas may feed into the cavity (152) and distributed to each of the trough array of holes (e.g., (trough array of holes 1 (124), trough array of holes 2 (130). A backing plate (162) borders the top of the electrode, which in FIG. 1C is the top of the cavity (152).

In one or more embodiments of the invention, the configuration of the electrode walls feeding the peak and/or trough array of holes, as well as the shapes of the holes, may vary. Examples of various configurations of electrodes and shapes of holes are shown in FIGS. 2A through 2E. In FIG. 2A, which shows a side view (i.e., a vertical cross section) of a portion of an electrode, shows the electrode wall (202) configured in the shape of a sinusoidal wave. Further, there are a number of holes (i.e., trough hole 1 (204), trough hole 2 (208), peak hole (206)) in the electrode wall (202) shown in FIG. 2A. As shown in FIG. 2A, the holes (i.e., trough hole 1 (204), trough hole 2 (208)) in the troughs of the electrode wall (202) create no other deviation from the electrode wall (202). In other words, the thickness and shape of the sinusoidal wave formed by the electrode wall (202) may otherwise not be changed by the trough holes (i.e., trough hole 1 (204), trough hole 2 (208)). On the other hand, the peak hole (i.e., peak hole (206)) in FIG. 2A deviates the shape of the sinusoidal wave formed by the electrode wall (202) by causing a slight protrusion of the electrode wall (202) on each side of peak hole 1 (206) toward the substrate (not shown). In other words, the electrode wall (202) at peak hole (206) forms a nozzle directed toward the substrate. In one or more embodiments of the invention, the nozzle may be cone-shaped.

FIG. 2B shows a top view (i.e., a horizontal cross section) of the same portion of the electrode shown in FIG. 2A. In this case, all holes (i.e., trough hole 1 (204), trough hole 2 (208), peak hole (206)) are circular. However, the trough holes (i.e., trough hole 1 (204), trough hole 2 (208)) are larger than peak hole (206). In one or more embodiments of the invention, the size and/or shape of each hole, whether peak or trough, in an electrode may vary to control the speed and/or flow pattern (disbursement) of a gas (e.g., reactive gas, precursor gas) to a space between the electrode and a substrate. Here, because peak hole (206) is smaller than the trough holes (i.e., trough hole 1 (204), trough hole 2 (208)), and because the electrode wall (202) protrudes toward the substrate at peak hole (206) where the electrode wall (202) is flush with regard to the trough holes, the precursor gas (not shown) may exit the electrode through peak hole (206) at a higher rate and in a tighter disbursement pattern than the reactive gas (not shown) that exits the trough holes.

The holes (or array of holes) may be located at any point in the peaks and/or troughs. For example, as shown in FIGS. 2A and 2B, the holes (or array of holes) are located at the highest (or lowest) point, such as a peak apex for each peak and a trough apex for each trough. The holes (or array of holes) may also be located at some other point in the peak and/or trough, including but not limited to an offset location from the apex.

FIG. 2C, which shows a side view (i.e., a vertical cross section) of a portion of an electrode, shows the electrode wall (212) configured in the shape of a sawtooth. Further, there are a number of holes (i.e., peak hole 1 (214), peak hole 2 (218), trough hole (216)) in the electrode wall (212) shown in FIG. 2C. The hole (i.e., trough hole (216)) in the trough of the electrode wall (212) creates no other deviation from the electrode wall (212). In other words, the thickness and shape of the sawtooth shape formed by the electrode wall (212) is otherwise not changed by trough hole (216). Likewise, the peak holes (i.e., peak hole 1 (214), peak hole 2 (218)) in FIG. 2C does not otherwise alter the shape and/or thickness of the sawtooth shape formed by the electrode wall (212).

The electrode wall may have different shapes than those shown in FIGS. 2A and 2C. An electrode wall may have varying shapes and/or thicknesses between adjacent arrays of holes. Typically, an electrode wall has a thickness of 50 mm, but may range from 20 mm to 200 mm. The electrode wall, particularly near a hole, may have one or more shape characteristics, including but not limited to flat, rounded, stepwise angular, protruding (as a nozzle, described above), concave, and convex. The term "exit point" may be used to refer to a point in a hole, nozzle, or other opening in a peak or trough where a gas (e.g., reactive gas, precursor gas) exits the electrode.

FIG. 2D shows a top view (i.e., a horizontal cross section) of the same portion of the electrode shown in FIG. 2C. In this case, the shape of the peak holes (i.e., peak hole 1 (214), peak hole 2 (218)) and the shape of trough hole (216) is circular, approximately in the form of a circle, all having approximately the same size.

Each hole (e.g., trough hole, peak hole) may be created using one of a number of methods, including but not limited to using a drill and using a punch. As shown by example in FIG. 2E, a hole may have a uniform or varying width from the opening inside the electrode to the opening outside the electrode. The walls of a hole may have a convex shape (220), a flat shape (222), or a concave shape (224). For example, the walls of hole 1 (224) form an acute angle with the inner electrode wall (222) and an obtuse angle with the outer electrode wall (220). As another example, the walls of hole 2 (226) are perpendicular with both the inner electrode wall (222) and the outer electrode wall (220). Further, the walls of hole 3 (228) form an obtuse angle with the inner electrode wall (222) and an acute angle with the outer electrode wall (220). While the walls of the holes (e.g., hole 1 (224), hole 2 (226), hole 3 (228)) shown in FIG. 2E are straight, the walls may also be rounded.

In one or more embodiments of the invention, an array of holes along a peak and/or trough may have different shapes (or variations of shapes) and/or sizes. Further, the shape and/or thickness of an electrode wall between an array of peak holes and/or an array of trough holes may differ within an electrode. Further, the distance between adjacent holes in an array of holes may vary. For example, adjacent holes in an array of holes may be spaced 5 mm apart, but may range from 2 mm to 20 mm. The distribution of each array of holes and/or the size of each hole are determined in order to create uniformity of deposition required for processing the substrate.

Figure 3B:
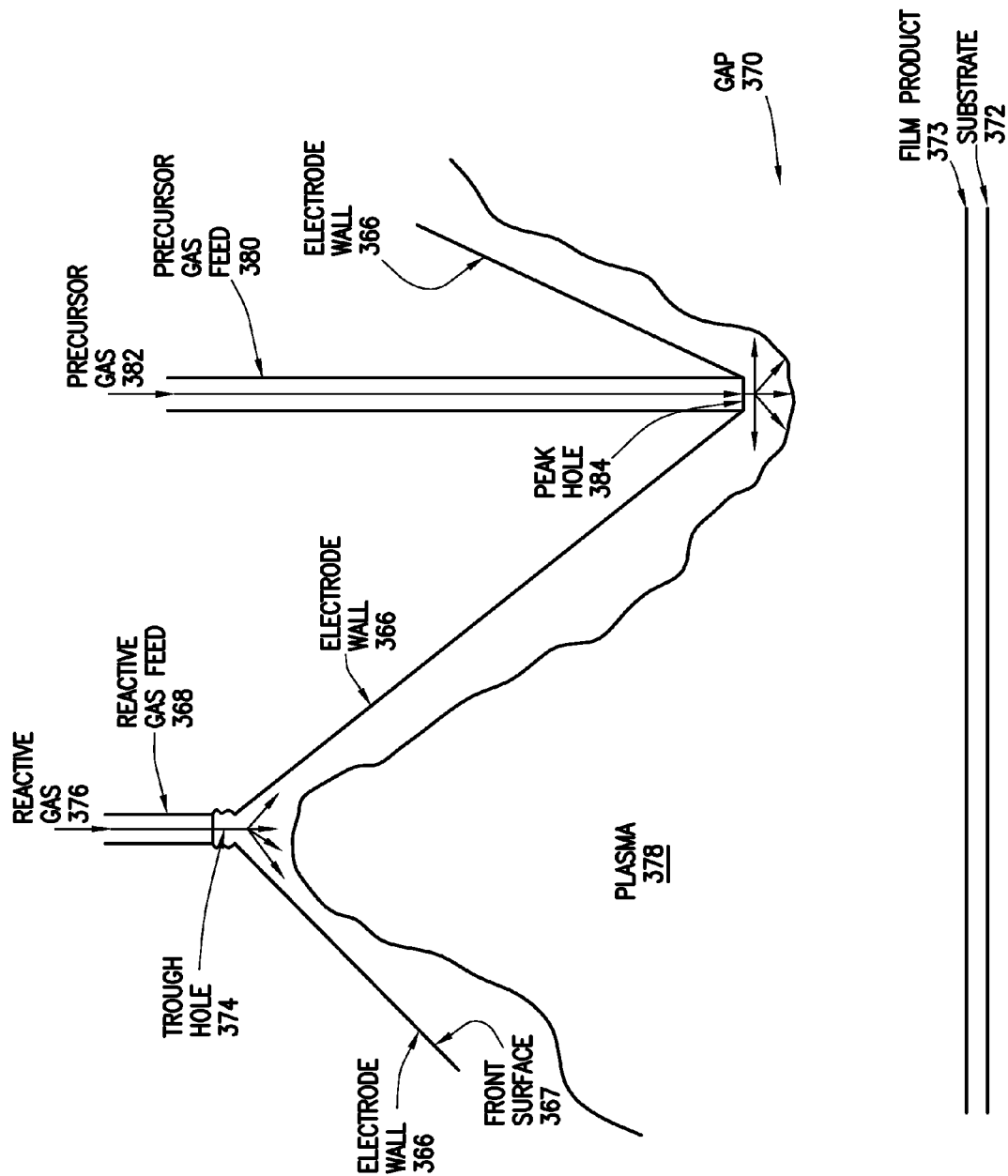

In one or more embodiments of the invention, each gas fed into the array of holes is facilitated by one or more gas feeds. FIGS. 3A and 3B each show gas feed configurations for an electrode. Some or all of each gas feed may be considered part of the electrode or separate from the electrode. In cases where a reactive gas and a precursor gas are used to process the substrate, a separate gas feed may be used for each type of gas. In some cases, a type of gas may be a mixture of gases. For example, a reactive gas may be a mixture of nitrogen ($N_2$) and ammonia ($NH_3$) for the formation of silicon nitride. Further, a precursor gas may be silane ($SiH_4$).

FIG. 3A shows a side view (i.e., a vertical cross section) of a portion of a linear plasma system. In FIG. 3A, an electrode is shown as an embodiment with three peak arrays of holes (peak array of holes 1 (322), peak array of holes 2 (326), and peak array of holes 3 (330)), two trough arrays of holes (trough array of holes 1 (324) and trough array of holes 2 (328)), a cavity (352), a precursor gas feed (362), and a reactive gas feed (364). Also shown in FIG. 3A is a power source (302), a heater (304), the substrate (354), the leading edge of the electrode (348), and the trailing edge of the electrode (350). In one or more embodiments of the invention, the precursor gas feed (362) feeds precursor gas into each of the peak array of holes (e.g., peak array of holes 1 (322)). The openings for each of the array of holes in FIG. 3A are not shown.

As shown in FIG. 3A, the precursor gas feed (362) may pass through the cavity (352) of the electrode and branch out to each of the peak array of holes through a network of precursor gas piping (310) in the back of electrode (311) so that the precursor gas distributed to each of the peak array of holes. In one or more embodiments of the invention, the precursor gas feed (362) may branch out to each of the peak array of holes through the network of precursor gas piping (310) along the border between the back of electrode (311) and the cavity (352) or inside the cavity (352). The network of precursor gas piping (310) for the precursor gas feed (362) may be sized and configured to ensure that the precursor gas is distributed substantially evenly to each of the peak array of holes. In one or more embodiments of the invention, the network of precursor gas piping (310) may be considered part of the precursor gas feed (362).

Continuing with FIG. 3A, the reactive gas feed (364) delivers reactive gas into the cavity (352), which distributes the reactive gas to a number of openings (not shown) at the bottom of the cavity (352). Each opening at the bottom of the cavity (352) may deliver reactive gas from the cavity (352) to one or more arrays of holes (e.g., trough array of holes 2 (328)) using a network of reactive gas piping (312). The network of reactive gas piping (312) for the reactive gas feed (364) may be sized and configured to ensure that the reactive gas is distributed substantially evenly to each of the trough array of holes. In one or more embodiments of the invention, the network of reactive gas piping (312) may be considered part of the reactive gas feed (364). Further, in embodiments of the invention, the precursor gas feed (362) may feed into the cavity (352), where the precursor gas is distributed to one or more of the peak array of holes using the network of precursor gas piping (310). In such a case, the reactive gas feed (364) may pass through the cavity (352) and branch out in the back of electrode (311) to one or more of the trough arrays of holes though the network of reactive gas piping (312).

The precursor gas feed (362), reactive gas feed (364), network of precursor gas piping (310), and network of reactive gas piping (312) may be made from one of a number of materials, including but not limited to stainless steel and aluminum. The precursor gas feed (362), reactive gas feed (364), network of precursor gas piping (310), and network of reactive gas piping (312) may be sized to provide desired operating conditions during operation of the linear plasma system. Examples of operating conditions include, but are not limited to, pressure and temperature. A typical size of a precursor gas feed (362) and a reactive gas feed (364) may range from 3 mm diameter to 30 mm diameter, with a typical size being 10 mm in diameter. A typical size of a network of precursor gas piping (310) and a network of reactive gas piping (312) may range from 3 mm diameter to 30 mm diameter, with a typical size being 10 mm in diameter.

The power source (302) may be any source of power capable of delivering an amount of energy (or range of energies) to the electrode required to generate plasma in the presence of the precursor gas and/or the reactive gas. In FIG. 3A, the power source (302) is connected to the backing plate (314) along the top of the cavity (352). In one or more embodiments of the invention, the power source (302) applies radio frequency energy to the electrode. A frequency of the radio frequency energy may be, for example, between 40 kHz and 60 MHz. The power source (302) may emit a particular frequency or range of frequencies based on the requirements of the substrate to be processed and/or the manner in which the substrate is processed. Further, the amount of radio frequency energy applied by the power source (302) may vary depending on other factors, including but not limited to the dimensions (e.g., length, width) of the electrode, the desired film product to be deposited on the substrate, and the rate of deposition on the substrate. When an electrode is one meter long, the energy applied by a power source (302) may be between 1 kW and 10 kW. The power source (302) may supply energy to one or more electrodes in a linear plasma system. In one or more embodiments of the invention, the power source (302) may be a bipolar power supply that applies energy (e.g., radio frequency energy) alternately between two electrodes that are electrically insulated from, but positioned in series with, each other relative to the motion of the substrate during processing.

In one or more embodiments of the invention, a heater (304) is used to transfer heat energy to the substrate (354). The substrate (354) may also be heated before entering the vacuumed chamber that includes the electrode. Heating the substrate (354) may encourage the activated precursor to adhere to the substrate (354). Heating the substrate (354) may also provide energy to enhance the quality of the film product (e.g., thin film) coating on the substrate (354). Further, the heater (304) may be electrically grounded or biased to further enhance the density of the plasma and enhance the film product deposited on the substrate.

FIG. 3B shows a side view (i.e., a vertical cross section) of a portion of a linear plasma system. Specifically, FIG. 3B shows various ways in which a gas feed may be configured with regard to one or more holes. On the left side of FIG. 3B, a trough hole (374) in the electrode wall (366) is shown. Also shown, just above the trough hole (374) inside the electrode, is the reactive gas feed (368), which delivers the reactive gas (376) to the trough hole (374). In one or more embodiments of the invention, the reactive gas feed (368) is the same as a network of reactive gas piping, described below. As the reactive gas (376) in FIG. 3B is released just above the trough hole (374). The reactive gas (376) travels through the trough hole (374) into the gap (370) between the electrode wall (366) and the substrate (372), where the reactive gas (376) is disbursed toward the substrate (372). Then, most of the reactive gas (376) mixes with the precursor gas (382), released through the peak hole (384), in the gap (370). Some of the reactive gas (376) traverses down the front surface (367) of the electrode wall (366) to prevent the precursor gas (382) from contaminating the electrode wall (366).

In one or more embodiments of the invention, the mixture of the reactive gas (376) and the precursor gas (382) in the gap (370), when combined with the energy delivered from the power source (not shown) to the electrode and radiated from the electrode wall (366) into the gap (370), generates plasma (378). Specifically, the energy reacts with the reactive gas (376) and the precursor gas (382) to form dynamic ions (e.g., positive and/or negative charges). The interaction of the plasma (378) with additional mixtures of the reactive gas (376) and the precursor gas (382) in the gap (370) creates a film product (373) on the substrate (372). In one or more embodiments of the invention, the film product (373) is a product of activated precursor and reactive gas. The film product (373) may be a substantially uniform deposit of the product on the substrate (372).

In one or more embodiments of the invention, the power source delivers radio frequency (RF) energy. The RF energy may include electromagnetic energy that couples to electrons in the reactive gas to generate plasma. The energy created from the coupling of the electromagnetic energy to the electrons in the mixture of the reactive gas (376), the precursor gas (382), and the plasma (378) allows the film product (373) to be deposited onto and process the substrate (372) in a manner intended for a particular application.

On the right side of FIG. 3B, a peak hole (384) in the electrode wall (366) is shown. Also shown, at the peak hole (384), is a precursor gas feed (380), which delivers the precursor gas (382) at the peak hole (384). The precursor gas (382) travels through the peak hole (384) into gap B (371). In one or more embodiments of the invention, the precursor gas feed (380) is the same as a network of precursor gas piping, described below. As the precursor gas travels toward the substrate (372) into gap B (371), some of the precursor gas (382) interacts with the energy that is radiated from the electrode wall (366) to form activated precursor (386). The activated precursor (386) may flow toward the substrate (372) until the activated precursor (386) contacts the substrate (372).

Further, some of the precursor gas (382) mixes with some of the reactive gas (376) in gap B (371) as the reactive gas (376) travels from the trough hole (374) to the peak hole (384). In the plasma environment, the mixture of the precursor gas (382) and the reactive gas (376) in gap B (371) react to form a deposit on the substrate (372) as the plasma (378) contacts the substrate (372). The sawtooth shape of the electrode wall (366) is designed to enable the reactive gas (376) to shield the precursor gas (382) from the outer electrode wall (366). In other words, the reactive gas (376) acts as a gas shield from the precursor gas (382) reaching the electrode wall (366). As a result, a build-up of coating caused by the precursor gas (382) on the electrode wall (366) may be reduced or eliminated. Any remaining reactive gas (376) may be removed by a vacuum pumping system (not shown).

In addition to the configurations shown in FIG. 3B, a gas feed (e.g., the reactive gas feed (368), the precursor gas feed (380)) may be positioned to release a gas (e.g., reactive gas (376), precursor gas (382)) through a hole (e.g., trough hole (374), peak hole (384)) outside the electrode in a gap (e.g., gap A (370), gap B (371)) between the electrode wall (366) and the substrate (372).

Figure 4:
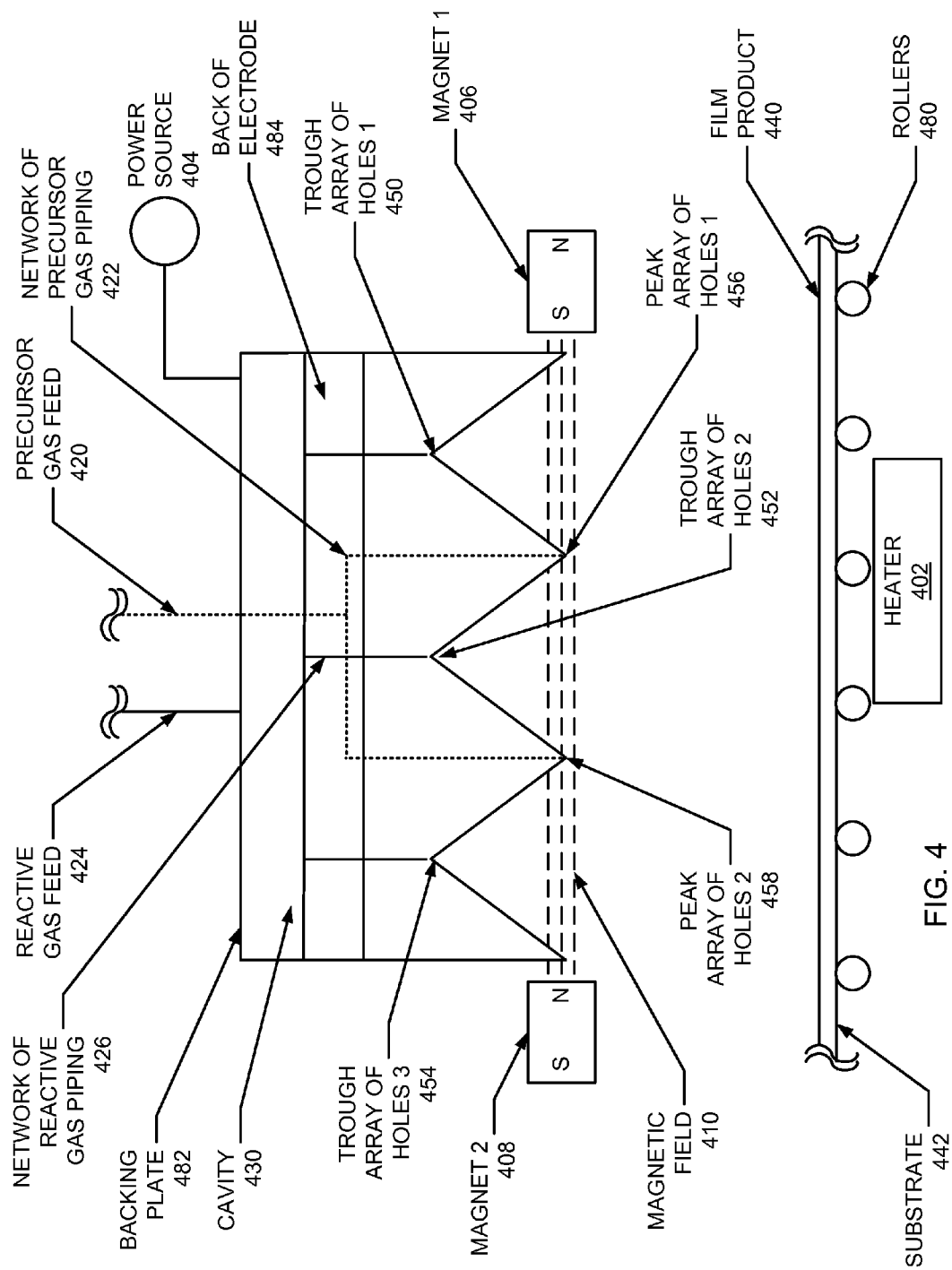
FIGS. 4 through 6 each show a linear plasma system in accordance with one or more embodiments of the invention.
Figure 5:
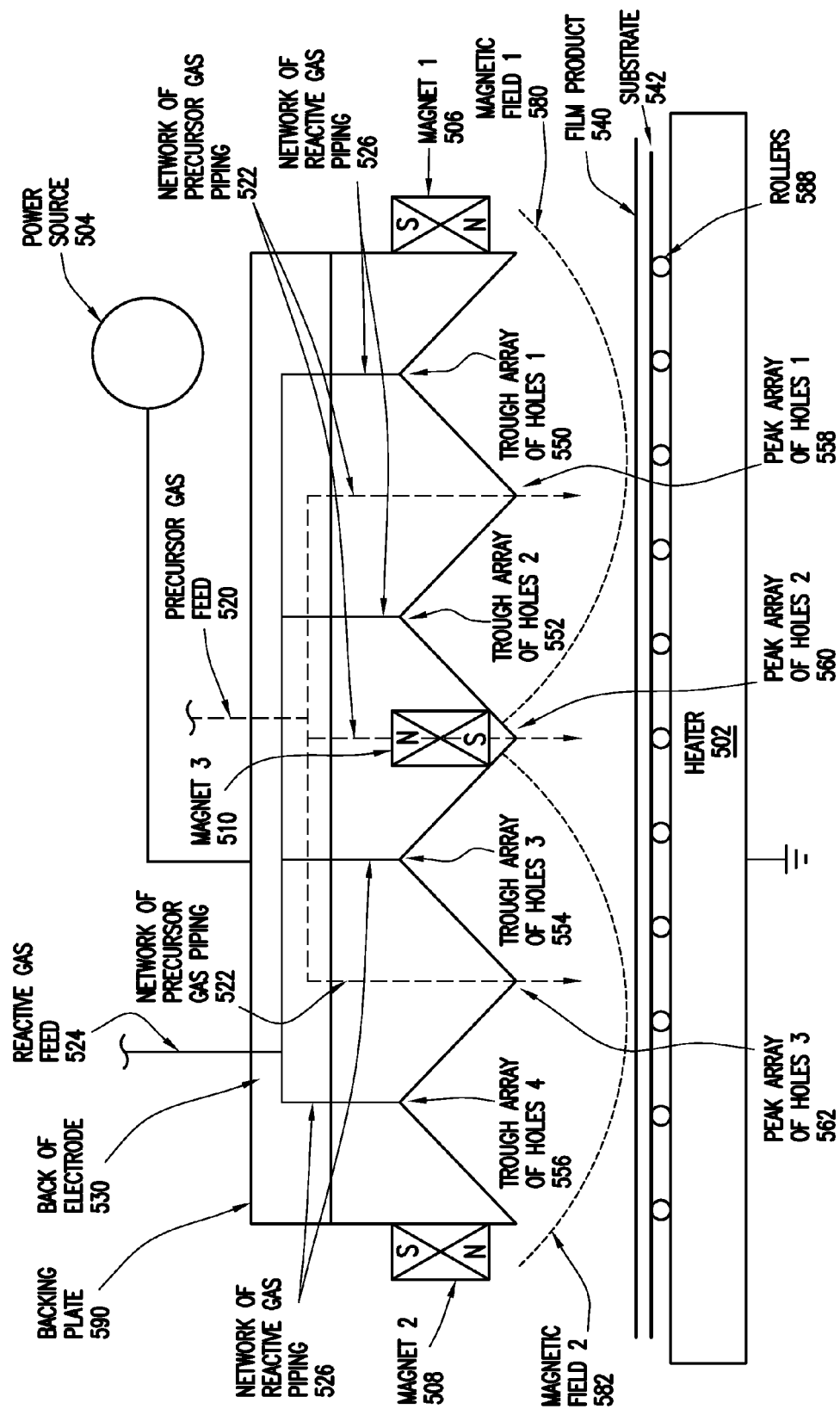
Figure 6:
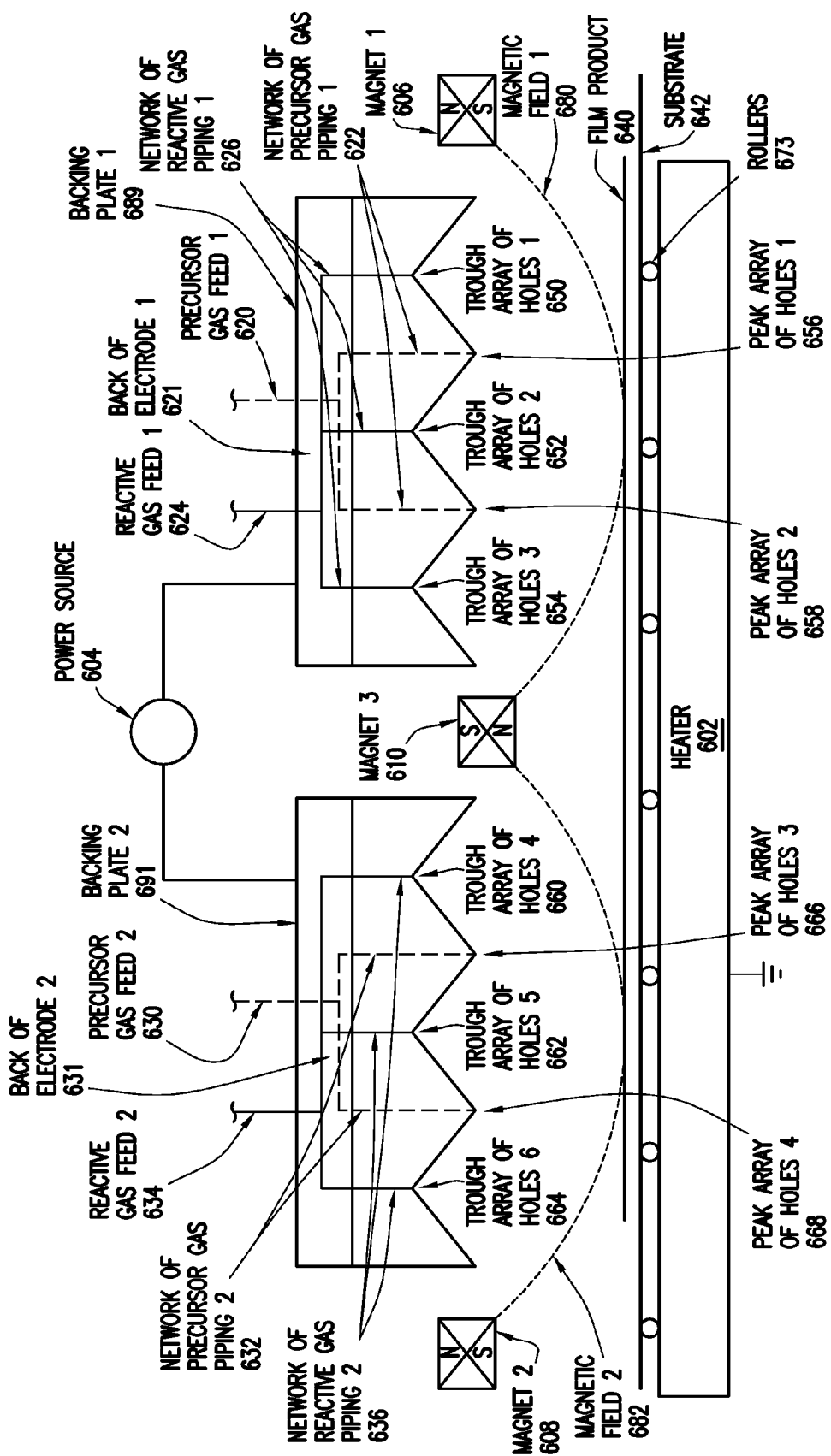

FIGS. 4 through 6 show embodiments of the invention where magnets are used to enhance the density of the plasma to generate more activated precursor. FIG. 4 shows an electrode configured similar to the electrode described above with respect to FIG. 1A. Specifically, the sawtooth shape shown in FIG. 4 includes two arrays of holes (peak array of holes 1 (456) and peak array of holes 2 (458)) with a concave shape at the bottom of the sawtooth electrode and three arrays of holes (trough array of holes 1 (450), trough array of holes 2 (452), and trough array of holes 3 (454)) with a convex shape at the top of the sawtooth electrode.

FIG. 4 further shows a reactive gas feed (424) feeding into a cavity (430), where reactive gas is distributed to a network of reactive gas piping (426) feeding the trough arrays of holes (i.e., trough array of holes 1 (450), trough array of holes 2 (452), and trough array of holes 3 (454)). A precursor gas feed (420) delivers precursor gas through the cavity (430) to the back of electrode (484), where the precursor gas is distributed to a network of precursor gas piping (422) feeding the precursor gas to the peak arrays of holes (i.e., peak array of holes 1 (456) and peak array of holes 2 (458)).

FIG. 4 also shows a power source (404) connected to the backing plate (482) at the top of the electrode. A substrate (442) moves along a series of rollers (480) for processing. Further, a heater (402) that is electrically grounded is located below the rollers (480) to provide heat energy to the substrate (442). As the substrate (442) is processed, a film product (440) is deposited onto the substrate (442). Two magnets are also shown in FIG. 4. On one side of the electrode at approximately a level where the openings (not shown) of the peak arrays of holes (e.g., peak array of holes 1 (456), peak array of holes 2 (458)) are located, is magnet 1 (406).

In one or more embodiments of the invention, magnet 1 (406) is oriented vertically, so that one pole of magnet 1 (406) is directed toward the electrode, and the other pole of magnet 1 (406) is directed away from the electrode. The magnetic polarity may be referred to as north and south. In this example, magnet 1 (406) is oriented so that the north polarity is directed away from the electrode, and the south polarity is directed toward the electrode. Magnet 2 (408) may be located on the opposite end of the electrode at approximately the same height from the substrate (440) as magnet 1 (406) and oriented in the same direction as magnet 1 (406). In this example, magnet 2 (408) is oriented so that the north polarity is directed toward the electrode, and the south polarity is directed away from the electrode.

By orienting magnet 1 (406) and magnet 2 (408) as described above, a magnetic field (410) is created. Magnet 1 (406) and magnet 2 (408) may each be one of any type of magnet, including but not limited to a permanent magnet, a temporary magnet, and an electromagnet. Further, magnet 1 (406) and magnet 2 (408) may be any size and/or shape to provide a desired magnetic field (410) to the plasma. For example, magnet 1 (406) and magnet 2 (408) may each be as long as the width of the substrate (440) or the length of the electrode. Alternatively, magnet 1 (406) and/or magnet 2 (408) may be a series of smaller magnets, where each of the series of smaller magnets may be positioned on one side of an array of holes (e.g., from trough array of holes 1 (450) through trough array of holes 3 (454)) along the length of the electrode. The distance between magnet 1 (406) and magnet 2 (408) may be less than or equal to the distance required to generate a minimum strength of the magnetic field (410). In one or more embodiments of the invention, the magnets (e.g., magnet 1 (406), magnet 2 (408)) may be shielded to prevent chemical and physical reactions with the activated plasma.

Magnet 1 (406) and magnet 2 (408) may also be orientated in one of a number of other configurations. For example, magnet 1 (406) and magnet 2 (408) may each be oriented so that one polarity (e.g., north polarity) is directed toward the substrate (442), and the other polarity (e.g., south polarity) is directed away from the substrate (442), as shown below with regard to FIG. 5.

In FIG. 5, the width of the electrode is greater than the distance required to generate a minimum strength of a magnetic field, as described above with regard to FIG. 4 in accordance with embodiments of the invention. As a result, an extra magnet must be used along the width of the electrode in FIG. 5 so that the magnetic field generated by the magnets is of sufficient strength to enhance the density of the plasma. Specifically, the sawtooth shape shown in FIG. 5 includes three arrays of holes (peak array of holes 1 (558), peak array of holes 2 (560), and peak array of holes 3 (562)) with a concave shape at the bottom of the sawtooth electrode and four arrays of holes (trough array of holes 1 (550), trough array of holes 2 (552), trough array of holes 3 (554), and trough array of holes 4 (556)) with a convex shape at the top of the sawtooth electrode.

FIG. 5 further shows a reactive gas feed (524) feeding into the back of electrode (530), where reactive gas is distributed to a network of reactive gas piping (526) feeding the trough arrays of holes (i.e., trough array of holes 1 (550), trough array of holes 2 (552), trough array of holes 3 (554), and trough array of holes 4 (556)). A precursor gas feed (520) delivers precursor gas to the back of electrode (530) to a network of precursor gas piping (522) feeding the precursor gas to the peak arrays of holes (i.e., peak array of holes 1 (558), peak array of holes 2 (560), and peak array of holes 3 (562)).

FIG. 5 also shows a power source (504) connected to the backing plate (590) at the top of the electrode. A substrate (542) moves atop a series of rollers (588) for processing. Further, a heater (502) that is electrically grounded is located below the rollers (588) to provide heat energy to the substrate (542). As the substrate (542) is processed, a film product (540) is deposited onto the substrate (542). Three magnets (i.e., magnet 1 (506), magnet 2 (508), and magnet 3 (510)) are also shown in FIG. 5. The three magnets in FIG. 5 are oriented horizontally.

On one side of the electrode at approximately a level where the openings (not shown) of the peak arrays of holes (e.g., peak array of holes 1 (558), peak array of holes 3 (562)) are located, is magnet 1 (506) with one polarity facing the substrate (540), and the other polarity facing away from the substrate (540). In FIG. 5, the north polarity of magnet 1 (506) faces the substrate (540), and the south polarity of magnet 1 (506) faces away from the substrate (540). Magnet 2 (508) is located on the opposite end of the electrode at approximately the same height from the substrate (540) as magnet 1 (506). The orientation of magnet 2 (508) may be the same as the orientation of magnet 1 (506). In FIG. 5, the north polarity of magnet 2 (508) faces the substrate (540), and the south polarity of magnet 2 (508) faces away from the substrate (540).

The third magnet in FIG. 5, magnet 3 (510), is vertically located in line with peak array of holes 2 (560), which is approximately halfway between either end of the electrode and magnet 1 (506) and magnet 2 (508). In one or more embodiments of the invention, magnet 3 (510) is located inside the electrode. Here, magnet 3 (510) is located inside the electrode, just above peak array of holes 2 (560).

In one or more embodiments of the invention, the orientation of magnet 3 (510) is opposite to the orientation of magnet 1 (506) and magnet 2 (508). In other words, the polarity of magnet 3 (510) may be opposite the polarities of magnet 1 (506) and magnet 2 (508), creating magnetic field 1 (580) between magnet 1 (506) and magnet 3 (510) and creating magnetic field 2 (582) between magnet 2 (508) and magnet 3 (510). As shown in FIG. 5, by orienting magnet 3 (510) so that the north pole of magnet 3 (510) faces away from the substrate (540) and so that the south pole of magnet 3 (510) faces toward the substrate (540), each magnetic field (e.g., magnet field 1 (580), magnetic field 2 (582)) may form a concave arc rather than a direct line between the magnets, as shown above with respect to FIG. 4.

Magnetic field 1 (580) may enhance the density of the plasma between the substrate (540) and trough array of holes 1 (550), trough array of holes 2 (552), and peak array of holes 1 (558). Magnetic field 2 (582) may enhance the density of the plasma between the substrate (540) and trough array of holes 3 (554), trough array of holes 4 (556), and peak array of holes 3 (562). The density of the activated precursor between peak array of holes 2 (560) and the substrate (540) may be enhanced by magnetic field 1 (580), magnetic field 2 (582), both magnetic fields, or neither magnetic field.

FIG. 6 shows a linear plasma system, according to embodiments of the invention, using two electrodes that are configured substantially identically. Specifically, two electrodes are placed in series with each other. The electrode on the right in FIG. 6 includes two arrays of holes (peak array of holes 1 (656) and peak array of holes 2 (658)) with a concave shape at the bottom of the sawtooth electrode and three arrays of holes (trough array of holes 1 (650), trough array of holes 2 (652), and trough array of holes 3 (654)) with a convex shape at the top of the sawtooth electrode. The electrode on the left side of FIG. 6 further shows reactive gas feed 1 (624) feeding into back of electrode 1 (621), where reactive gas is distributed to network of reactive gas piping 1 (626) feeding the trough arrays of holes (i.e., trough array of holes 1 (650), trough array of holes 2 (652), and trough array of holes 3 (654)). Precursor gas feed 1 (620) delivers precursor into back of electrode 1 (621) to network of precursor gas piping 1 (622) feeding the precursor gas to the peak arrays of holes (i.e., peak array of holes 1 (656) and peak array of holes 2 (658)).

Similarly, the electrode on the right side of FIG. 6 is configured with two arrays of holes (peak array of holes 1 (666) and peak array of holes 2 (668)) with a concave shape at the bottom of the sawtooth electrode and three arrays of holes (trough array of holes 1 (660), trough array of holes 2 (662), and trough array of holes 3 (664)) with a convex shape at the top of the sawtooth electrode. The electrode on the right of FIG. 6 further shows reactive gas feed 2 (634) feeding into back of electrode 2 (631), where reactive gas is distributed to a network of reactive gas piping 2 (636) feeding the trough arrays of holes (i.e., trough array of holes 1 (660), trough array of holes 2 (662), and trough array of holes 3 (664)). Precursor gas feed 2 (630) delivers precursor gas into back of electrode 2 (631) to network of precursor gas piping 2 (632)

feeding the precursor gas to the peak arrays of holes (i.e., peak array of holes 1 (666) and peak array of holes 2 (668)).

FIG. 6 also shows a power source (604) connected to both backing plate 1 (689) and backing plate 2 (691) at the top of each electrode. The power source (604) may be a bipolar alternating current power supply that concurrently supplies a positive voltage to one electrode and a negative voltage to the other electrode, and then alternates by supplying the opposite voltage concurrently to each electrode. A substrate (642) moves along a series of rollers (673) for processing. Further, a heater (602) that is electrically grounded is located below the rollers (673) to provide heat energy to the substrate (642). In such a configuration, the grounding source associated with the heater (602) may be absent. As the substrate (642) is processed, a film product (640) is deposited onto the substrate (642).

Three magnets are also shown in FIG. 6. Before the leading side of the electrode on the right and at approximately a level where the openings (not shown) of the peak arrays of holes (e.g., peak array of holes 1 (656), peak array of holes 2 (658)) are located, is magnet 1 (606). In one or more embodiments of the invention, magnet 1 (606) is oriented vertically, so that one pole of magnet 1 (606) is directed toward the substrate (640), and the other pole of magnet 1 (606) is directed away from the substrate (640). In FIG. 6, magnet 1 (606) is oriented so that the north polarity is directed away from the substrate (640) and the south polarity is directed toward the substrate (640).

Magnet 2 (608) is located beyond the trailing edge of the electrode on the right in FIG. 6 and is also at approximately the same height from the substrate (640) as magnet 1 (606). The orientation of magnet 2 (608) may be the same as the orientation of magnet 1 (606). In other words, magnet 2 (608) is oriented so that the north polarity is directed away from the substrate (640) and the south polarity is directed toward the substrate (640), as shown in FIG. 6.

The third magnet in FIG. 6, magnet 3 (610), is located between the two electrodes and at approximately the same height from the substrate (640) as magnet 1 (606) and magnet 2 (608). In one or more embodiments of the invention, the orientation of magnet 3 (610) is opposite the orientation of magnet 1 (606) and magnet 2 (608). In other words, magnet 3 (610) may be oriented so that the north polarity is directed toward the substrate (640) and the south polarity is directed away from the substrate (640), as shown in FIG. 6.

As a result of the orientation of magnet 1 (606), magnet 2 (608), and magnet 3 (610), magnetic field 1 (680) may be created between magnet 1 (606) and magnet 3 (610) and magnetic field 2 (682) may be created between magnet 2 (608) and magnet 3 (610). Magnetic field 1 (680) may enhance the density of the plasma between the substrate (640) and trough array of holes 1 (650), trough array of holes 2 (652), trough array of holes 3 (654), peak array of holes 1 (656), and peak array of holes 2 (658). Magnetic field 2 (682) may enhance the density of the plasma between the substrate (640) and trough array of holes 4 (660), trough array of holes 5 (662), trough array of holes 6 (664), peak array of holes 3 (666), and peak array of holes 4 (668).

Figure 7:
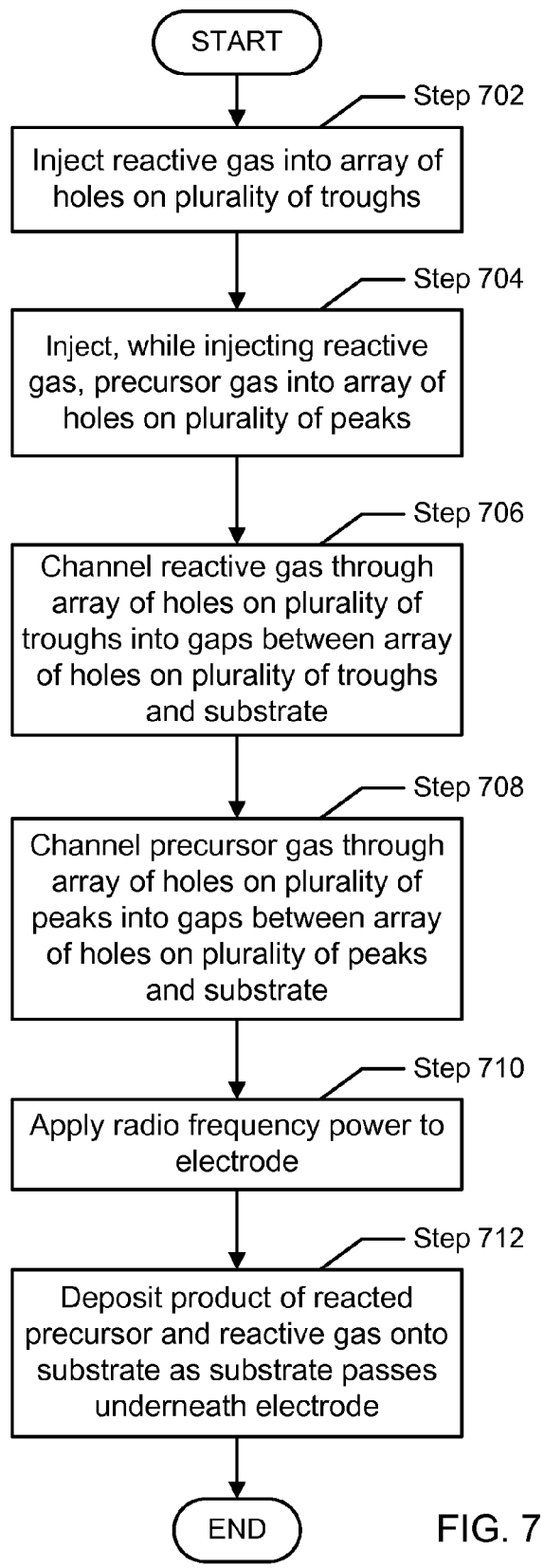
FIG. 7 shows a flowchart of a method in accordance with one or more embodiments of the invention.

FIG. 7 shows a flowchart of a method for processing a substrate using a linear plasma system. While the various steps in these flowcharts are presented and described sequentially, some or all of the steps may be executed in different orders, may be combined or omitted, and some or all of the steps may be executed in parallel. Further, in one or more of the embodiments of the invention, one or more of the steps described below may be omitted, repeated, and/or performed in a different order. In addition, additional steps, omitted in FIG. 7, may be included in performing these methods. Accordingly, the specific arrangement of steps shown in FIG. 7 should not be construed as limiting the scope of the invention.

In Step 702, a reactive gas is injected into an array of holes on a number of troughs. In one or more embodiments of the invention, an array of holes on a trough is called a trough array of holes. Each of the trough array of holes may be disposed on an electrode having a sawtooth shape. The reactive gas may be distributed in a cavity of the electrode before injecting the reactive gas into the trough arrays of holes. The cavity may be located above the trough arrays of holes within the electrode. In one or more embodiments of the invention, one or more reactive gas feeds is used to deliver the reactive gas to the electrode. The reactive gas feed may include a network of reactive gas piping that distributes the reactive gas to each trough array of holes in the electrode.

In Step 704, while injecting the reactive gas, a precursor gas is injected into an array of holes on a number of peaks. In one or more embodiments of the invention, each array of holes on the peaks is called a peak array of holes. Each peak array of holes may be disposed on the same electrode as the trough arrays of holes. There may be any number of holes in a peak array of holes. Further, there may be any number of peak arrays of holes, including the same as the number of trough arrays of holes. In one or more embodiments of the invention, one or more precursor gas feeds is used to deliver the precursor gas to the electrode. The precursor gas feed may include a network of precursor gas piping that distributes the precursor gas to each peak array of holes in the electrode.

In Step 706, the reactive gas is channeled through the holes in the trough arrays of holes into gaps between the trough arrays of holes and the substrate. In one or more embodiments of the invention, the network of reactive gas piping has one or more openings that release the reactive gas to each trough array of holes in the electrode. Such openings in the network of reactive gas piping may be located proximate to (e.g., slightly above, flush with, slightly below) the holes in the trough arrays of holes.

In Step 708, the precursor gas is channeled through the holes in each of the peak array of holes into gaps between the peak arrays of holes and the substrate. In one or more embodiments of the invention, the gap between the holes in the trough arrays of holes and the substrate is greater than the gap between the holes in the peak arrays of holes and the substrate. The network of precursor gas piping has one or more openings that release the precursor gas to each peak array of holes in the electrode. Such openings in the network of precursor gas piping may be located proximate to (e.g., slightly above, flush with, slightly below) the openings in the peak array of holes.

In Step 710, radio frequency power is applied to the first electrode. In one or more embodiments of the invention, the radio frequency power, emitted from the electrode, interacts with the reactive gas to generate plasma in each gap between a trough array of holes and the substrate. The reactive gas may be injected into the plasma through each of the trough array of holes. The reactive gas may disburse into each gap between a trough array of holes and the substrate. The reactive gas may be activated when the radio frequency power is transmitted to the plasma in each of the gaps between the trough array of holes and the substrate.

The radio frequency power may also interact with the precursor gas to generate activated precursor in each gap between the holes in each peak array of holes and the substrate. In embodiments of the linear plasma system, some of the reactive gas may also travel down the outer sides (i.e., outside the electrode) of the electrode walls toward the holes in each peak array of holes. As a result, the reactive gas acts as a shield between the electrode wall and the precursor gas so that little to none of the precursor gas comes into contact with the energized electrode, which would cause a build up of coating on the electrode. The remaining precursor gas and/or reactive gas may be removed (for example, using a vacuum pumping system) from the linear plasma system.

In Step 712, a product of the activated precursor and reactive gas is deposited onto the substrate as the substrate passes underneath the electrode. Specifically, the entire width of the substrate may be processed using the plasma and/or the activated precursor as the substrate passes under the electrode. In one or more embodiments of the invention, the product of the activated precursor and reactive gas may be used to process (e.g., create a film product upon) the substrate by mixing the reactive gas, the precursor gas, and the plasma. Specifically, the plasma may activate the mixture of reactive gas and precursor gas by energizing the mixture of the gases, resulting in activation of the precursor gas and reactive gas to form the product. As a result, the linear plasma system may operate for periods of time without stopping, making the process substantially continuous.

Further, using embodiments of the invention, there is little to no deposition (build up of coating) on the electrode, which means the electrode does not need to be cleaned. Consequently, because the electrode does not need to be cleaned, the plasma and the activated precursor may be stable. As a result, the linear plasma system may operate for periods of time without stopping, making the process substantially continuous. Thus, there is no interruption in the processing of one or more substrates.

The activated precursor and/or plasma may be used to process the substrate in different ways. For example, embodiments of the invention may be used for plasma enhanced chemical vapor deposition to deposit one or more film products on a substrate for applications related to a semiconductor, a display (e.g., a liquid crystal display), a solar cell, a glass coating, and a flexible substrate coating. Embodiments of the invention may be used for other processing techniques, including but not limited to plasma surface treatment, plasma etching, and ion implantation.

Optionally, a magnetic field may be applied, parallel to the substrate and in an area below the holes in each of an array of holes, to enhance the density of the plasma used to process some (e.g., a top surface) or all of the substrate. In one or more embodiments of the invention, the substrate is processed continuously over the length of the substrate. Further, the magnetic field may be applied below the electrode and above the substrate.

The following description (in conjunction with FIGS. 1 through 7) describes a number of examples in accordance with one or more embodiments of the invention. The examples are for explanatory purposes only and are not intended to limit the scope of the invention. Terminology used in FIGS. 1 through 7 may be used in the examples without further reference to FIGS. 1 through 7.

Example

Figure 8:
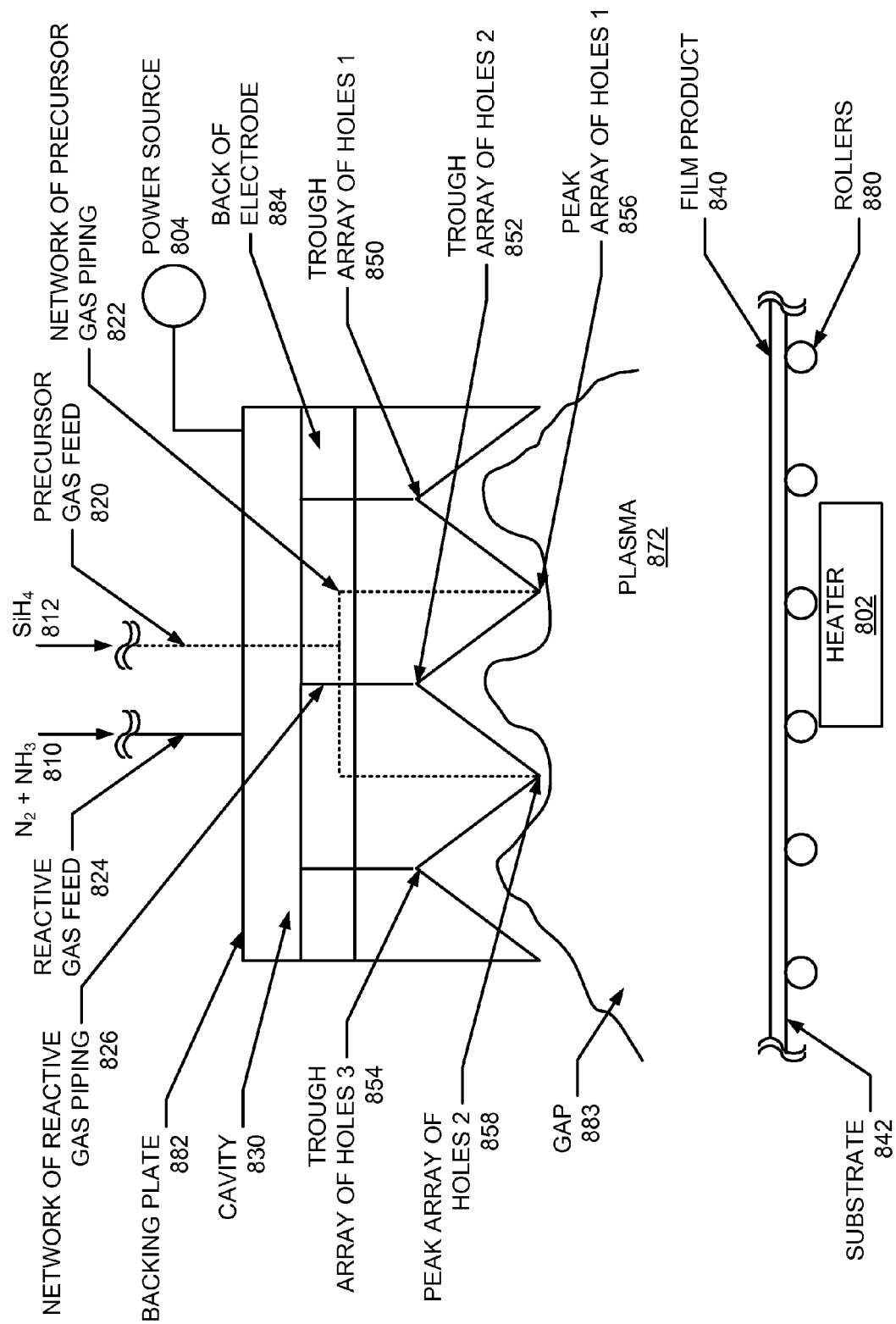
FIG. 8 shows an example of processing a substrate using a linear plasma system in accordance with one or more embodiments of the invention.

Consider the following example, shown in FIG. 8, which describes using a linear plasma system to process a substrate in accordance with one or more embodiments described above. Specifically, reactive gas and precursor gas are each simultaneously fed into arrays of holes in the electrode and sent outside the electrode through the holes in the arrays of holes, where the reactive gas and precursor gas each interact with energy emitted from the electrode to generate plasma and activated precursor that is deposited on a substrate.

In this example, consider the scenario in which a reactive gas that includes nitrogen ($N_2$) and ammonia ($NH_3$) is fed through the reactive gas feed (824) to the electrode shown in FIG. 8. The reactive gas $N_2+NH_3$ (810) is fed into the cavity (830) of the electrode, where the reactive gas $N_2+NH_3$ (810) is distributed to the network of reactive gas piping (826), which distributes the reactive gas $N_2+NH_3$ (810) at the trough arrays of holes (i.e., trough array of holes 1 (850), trough array of holes 2 (852), and trough array of holes 3 (854)).

Simultaneously, as the reactive gas $N_2+NH_3$ (810) is fed through the reactive gas feed (824), a precursor gas that includes silane ($SiH_4$) is fed through the precursor gas feed (820) to the electrode. The precursor gas $SiH_4$ (812) is fed through the cavity (830) of the electrode to the back of electrode (884) and distributed to the network of precursor gas piping (822), which deposits the precursor gas $SiH_4$ (812) at the peak arrays of holes (i.e., peak array of holes 1 (856) and peak array of holes 2 (858)).

As the reactive gas $N_2+NH_3$ (810) is released into the trough arrays of holes (i.e., trough array of holes 1 (850), trough array of holes 2 (852), and trough array of holes 3 (854)), the reactive gas $N_2+NH_3$ (810) travels out of the electrode to the gap (883) between the trough arrays of holes and the substrate (840). Likewise, as the precursor gas $SiH_4$ (812) is released into the peak arrays of holes (i.e., peak array of holes 1 (856) and peak array of holes 2 (858)), the precursor gas $SiH_4$ (812) travels out of the electrode to the gap (883) between the peak arrays of holes and the substrate (842). In one or more embodiments of the invention, the reactive gas $N_2+NH_3$ (810) and the precursor gas $SiH_4$ (812) mix in the gap (883). The amount of reactive gas $N_2+NH_3$ (810) and the amount of precursor gas $SiH_4$ (812) in the mixture may vary at different points in the gap (883). For example, just outside a trough arrays of holes (e.g., trough array of holes 1 (850), trough array of holes 2 (852), and trough array of holes 3 (854)), the concentration of reactive gas $N_2+NH_3$ (810) in the mixture may be higher than the concentration of precursor gas $SiH_4$ (812).

While the precursor gas $SiH_4$ (812) and the reactive gas $N_2+NH_3$ (810) are flowing, the power source (804) delivers energy to the backing plate (882) of the electrode. The power source (804) may deliver energy to one or more other parts of the electrode. In this example, the energy delivered by the power source (804) is RF energy at a frequency of 13.6 MHz. The RF energy is then transferred through the electrode and radiates out toward the gap (883) between the electrode and the substrate (842). Because of the manner in which the electrode is shaped, a hollow cathode effect is generated. Consequently, the RF energy reacts with a mixture of a portion of the reactive gas $N_2+NH_3$ (810) and a portion of the precursor gas $SiH_4$ (812) to create the plasma (872) in the gap (883).

When the plasma (872) is formed in the gap (883), the plasma (872) interacts with additional precursor gas $SiH_4$ (812) and reactive gas $N_2+NH_3$ (810) to form activated precursor and reactive gas. Specifically, the plasma activates the additional precursor gas $SiH_4$ (812) and reactive gas $N_2+NH_3$ (810) by injecting energy into the additional precursor gas $SiH_4$ (812) and reactive gas $N_2+NH_3$ (810). The plasma (872) may interact with the additional precursor gas $SiH_4$ (812) and reactive gas $N_2+NH_3$ (810) at any of a number of points within the gap (883). The activated precursor and reactive gas create a film product (840) that is deposited on the substrate (842).

Some of the reactive gas $N_2+NH_3$ (810) also flows down the electrode walls on the outside (i.e., along the front surface) of the electrode toward the peak arrays of holes (i.e., peak array of holes 1 (856) and peak array of holes 2 (858)), where the reactive gas $N_2+NH_3$ (810) acts as a gas shield from the precursor gas $SiH_4$ (812) contacting the front surface of the electrode walls. As a result, there is little to no a build up of coating that is created when the precursor gas contacts the electrode surface. Consequently, there is little to no degradation of the RF conductance into the plasma and/or product of reactive precursor and reactive gas. Further, there is less need to shut down the linear plasma system so that the coating may be cleaned off the electrode.

In the meantime, the substrate (842) moves under the electrode on a series of rollers (880) to be processed. Specifically, as the substrate (842) moves from right to left, a film product (840) of silicon nitride ($Si_xN_y$) is formed on the substrate surface. Further, in this example, the substrate (842) is heated by a heater (802) that is electrically grounded. The properties of the silicon nitride may be affected by a number of factors, including but not limited to the gas flow composition, the RF power level, and the heating temperature.

In one or more embodiments of the invention, the film product (840) (in this example, the product of activated precursor and reactive gas) is applied substantially uniform to the substrate (842). The degree of uniformity may depend on a number of factors, including but not limited to the pressure of the gas (e.g., reactive gas $N_2+NH_3$ (810), precursor gas $SiH_4$ (812)), the size and shape of one or more holes (e.g., trough array of holes 1 (850), peak array of holes 2 (858)), the speed at which the substrate (842) moves during processing, the pressure and temperature of the processing chamber, the amount of RF power applied to the electrode.

In another example of application, the reactive gas can be $O_2$ and precursor precursor gas is silane. Under the similar operation condition, a silicon oxide (SiOx) film is formed on the substrate.

In yet another example of application, the reactive gas may be $O_2$, and the precursor gas is tri-methyl aluminum (Al $(CH_3)_3$). Under similar operating conditions, an aluminum oxide ($AlO_x$) film may form on the substrate.

In yet another example of application, the reactive gas may be $H_2$, and the precursor gas may be silane. Under similar operating conditions, a silicon film (commonly called hydrogenated amorphous silicon) may form on the substrate.

A new linear plasma source is invented in this invention that can significantly broaden the application of linear plasma process applications. Because of the continuous operation that may occur using embodiments of the invention, enhancement to processing procedures such as plasma enhanced chemical vapor deposition, plasma etching, plasma surface treatment, plasma enhanced chemical vapor deposition, and ion implantation may be improved.

One or more embodiments of the invention provide for a linear plasma system applying plasma and/or activated precursor to a substrate. Specifically, embodiments of the invention allow the substrate to be of potentially endless length so that the substrate is processed continuously. In other words, because the precursor gas and/or activated precursor causes little to no build up of coating on the electrode surface, the process of depositing plasma and/or activated precursor does not need to be stopped to clean the electrode using embodiments of the invention. Coating on the electrode surface degrades the energy (e.g., radio frequency energy) conductance into the plasma.

In embodiments of the invention, when processing the substrate requires a high speed of deposition of plasma and/or activated precursor, a magnetic field generated by two or more magnets may be used to enhance the plasma density. The magnetic field may also conduct more power to the substrate surface to activate the surface reaction with the plasma and/or activated precursor. Using embodiments of the invention, the magnetic field is substantially uniform across the width of the electrode, creating a more consistent deposition of plasma and/or activated precursor to the substrate.

Further, embodiments of the invention may allow for a bias voltage to be applied under the substrate. The bias voltage may be negative so that ions in the plasma and/or activated precursor may accelerate to the substrate surface. Using this configuration in embodiments of the invention may be beneficial when high energy ions are beneficial to the deposition process.

In embodiments of the invention, two electrodes may be arranged in parallel to each other. In such a configuration, a single power source generates energy that is split into two channels (one channel for each electrode) in alternate polarity. The alternating positive and negative energy distributed to each of the two electrodes (as well as the plasma and/or activated precursor generated by the two electrodes) may eliminate the need to tie the substrate to an electrical ground. Having two electrodes operating in parallel in such a fashion may double the width of the plasma and/or activated precursor deposited onto the substrate, and so enhance the deposition rate.

In embodiments of the invention, as in the previous paragraph, multiple (i.e., more than two) electrodes may be arranged in one of a number of ways with one or more power sources to further increase the processing zone. Similarly, two or more magnets may be used to enhance the density of the plasma and/or activated precursor. Such embodiments of the invention may result in processing the substrate more quickly.

In other embodiments of the invention, each electrode, and/or portions of an electrode, may have multiple precursor and/or reactive gas feeds. In other words, more than one precursor gas and/or more than one reactive gas may be used to process the same substrate. For example, different types of film products may be deposited on the substrate, one film type for each reactive gas fed to an electrode. In such embodiments of the invention, different functions may be achieved in a single process sequence. For example, an electrode may perform a surface treatment and another electrode may perform a deposition in sequence. In yet another example, one electrode may deposit one type of film product, and another electrode may deposit another type of film product. The number of electrodes processing one type of film product may be adjusted to achieve a desired thickness of the film product on the substrate.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:
1. A linear plasma system for processing a substrate, comprising:
a first electrode having a front electrode surface, the front electrode surface having a plurality of linear concave troughs that extend along a width of the first electrode, each of the plurality of linear concave troughs having a first array of holes located on the front electrode surface and proximate to a trough apex and a second array of holes located on the front electrode surface and proximate to a peak apex;

a second electrode located proximally to the first electrode and arranged in parallel, relative to a linear motion of the substrate during processing, with the first electrode, wherein the second electrode is substantially the same shape as the first electrode and is powered by a power source that is different from a power source that powers the first electrode;

a reactive gas feed disposed on the first electrode and configured to continuously release, through the first array of holes, a reactive gas into a gap between the front electrode surface and the substrate;

a precursor gas feed disposed on the first electrode and configured to continuously release, while the reactive gas feed releases the reactive gas, a precursor gas into the second array of holes; and wherein the power source that powers the first electrode is configured to apply radio frequency power to the first electrode to:

interact with a first portion of the reactive gas mixed with a first portion of the precursor gas to generate plasma that is confined to a gap between the first array of holes on the front electrode surface and the substrate;

generate a film product of an activated precursor and reactive gas in the gap caused by an interaction between the plasma, a second portion of the precursor gas, and a second portion of the reactive gas, wherein the film product of the activated precursor and reactive gas is deposited on the substrate as the substrate undergoes the linear motion underneath the first and second electrodes, and wherein the film product and the substrate are used to form a solar film product.

2. The linear plasma system of claim 1, further comprising:
a first series of permanent magnets located on a first outer side of the first electrode and having a first orientation; and
a second series of permanent magnets located on a second outer side, located opposite the first outer side, of the first electrode and having the opposite orientation from the first orientation,
wherein the first orientation and the second orientation create a magnetic field between the first and second series of permanent magnets,
wherein the magnetic field is applied to the plasma in the gap.

3. The linear plasma system of claim 1, further comprising:
a first series of permanent magnets located on a first outer side of the first electrode and having a first orientation;
a second series of permanent magnets located on a second outer side, located opposite the first outer side, of the first electrode and having the first orientation; and
a third series of permanent magnets located in a middle of the first electrode and having a second orientation,
wherein the second orientation is opposite the first orientation,
wherein the first and third series of permanent magnets form a first magnetic field,
wherein the second and third series of permanent magnets form a second magnetic field, and
wherein the first magnetic field and the second magnetic field is applied to the plasma in the gap.

4. The linear plasma system of claim 1, further comprising:
a cavity located atop a back of the first electrode, wherein the cavity is configured to uniformly distribute the reactive gas to the first array of holes, wherein the precursor gas feed passes through the cavity to the back of the electrode and distributes the precursor gas uniformly to the second array of holes.

5. The linear plasma system of claim 1, further comprising:
a heater located on a bottom side of the substrate and configured to radiate heat toward the bottom side of the substrate.

6. The linear plasma system of claim 1, wherein the plurality of linear concave troughs that extend along the width of the first electrode form a sawtooth shape on the front electrode surface.

7. The linear plasma system of claim 1, wherein the substrate has a width that is similar to a length of the first electrode.

8. The linear plasma system of claim 1, wherein the substrate moves continuously along its length.

9. The linear plasma system of claim 1, further comprising:
a cooling system configured to prevent the first electrode from overheating.

10. The linear plasma system of claim 1, further comprising:
a vacuum system configured to remove excess precursor gas and excess reactive gas.

11. The linear plasma system of claim 1, wherein each of the first array of holes and each of the second array of holes is circular.

12. The linear plasma system of claim 1, wherein the reactive gas comprises at least one of a group consisting of nitrogen ($N_2$), ammonia ($NH_3$), hydrogen ($H_2$), oxygen ($O_2$), nitrous oxide ($N_2O$), helium, and argon.

13. The linear plasma system of claim 1, wherein the precursor gas comprises at least one of a group consisting of silane ($SiH_4$), tetraethylorthosilicate (TEOS), trimethylaluminium ($Al(CH_3)_3$), borane, hydrocarbon, germanane, phosphine, tetramethyltin, and titanium tetrachloride ($TiCl_4$).

14. The system of claim 1, further comprising a second electrode reactive gas feed disposed on the second electrode and a second electrode precursor gas feed disposed on the second electrode, wherein the second electrode precursor gas feed and the second electrode reactive gas feed is fed from at least one gas source that also feeds the gas feeds disposed on first electrode.

* * * * *